(12) United States Patent
Werner et al.

(10) Patent No.: US 9,451,669 B2
(45) Date of Patent: Sep. 20, 2016

(54) CMOS ADJUSTABLE OVER VOLTAGE ESD AND SURGE PROTECTION FOR LED APPLICATION

(75) Inventors: Achim Werner, Hamburg (DE); Hans-Martin Ritter, Nahe (DE)

(73) Assignee: NXP B.V., Eindhoven (NL)

( * ) Notice: Subject to any disclaimer, the term of this patent is extended or adjusted under 35 U.S.C. 154(b) by 847 days.

(21) Appl. No.: 13/288,570

(22) Filed: Nov. 3, 2011

(65) Prior Publication Data
US 2013/0114169 A1    May 9, 2013

(51) Int. Cl.
*H02H 9/00* (2006.01)
*H05B 33/08* (2006.01)
*H01L 27/02* (2006.01)

(52) U.S. Cl.
CPC ....... *H05B 33/0884* (2013.01); *H01L 27/0255* (2013.01); *Y02B 20/341* (2013.01)

(58) Field of Classification Search
CPC ............ H05B 33/0884; Y02B 20/341; H01L 27/0255
USPC .................................................... 361/56, 111
See application file for complete search history.

(56) References Cited

U.S. PATENT DOCUMENTS

| | | | |
|---|---|---|---|
| 6,717,559 B2 | 4/2004 | Weindorf | |
| 7,262,752 B2 * | 8/2007 | Weindorf | 345/82 |
| 7,280,328 B2 * | 10/2007 | Arai et al. | 361/56 |
| 7,440,248 B2 * | 10/2008 | Arai et al. | 361/56 |
| 7,589,944 B2 * | 9/2009 | Mergens et al. | 361/56 |
| 8,120,887 B2 * | 2/2012 | Mallikararjunaswamy et al. | 361/111 |
| 8,373,956 B2 * | 2/2013 | Abou-Khalil et al. | 361/56 |
| 2003/0076636 A1 * | 4/2003 | Ker et al. | 361/56 |
| 2005/0057866 A1 | 3/2005 | Mergens et al. | |
| 2005/0173727 A1 | 8/2005 | Manna et al. | |
| 2005/0264963 A1 | 12/2005 | Sato | |
| 2006/0029478 A1 | 2/2006 | Newman | |

FOREIGN PATENT DOCUMENTS

| | | |
|---|---|---|
| CN | 1414678 | 4/2003 |
| CN | 1577855 | 2/2005 |
| CN | 101019292 | 8/2007 |
| CN | 201199010 Y | 2/2009 |
| EP | 1 355 355 A2 | 10/2003 |

OTHER PUBLICATIONS

Extended European Search Report dated Jan. 7, 2013 for European Application No. 12180332.4-2206.
Office Action from counterpart application CN201210422160.6 (Aug. 28, 2014).

* cited by examiner

*Primary Examiner* — Thienvu Tran
*Assistant Examiner* — Tien Mai
(74) *Attorney, Agent, or Firm* — Rajeev Madnawat

(57) ABSTRACT

Various embodiments relate to a light emitting diode protection circuit, including: a plurality of diodes connected in series; an input connected to a first diode of the plurality of diodes; an output; a first resistor connected between the plurality of diodes and the output; a transistor with a gate connected to a junction between the first resistor and the plurality of diodes and a source connected to the output; a second resistor connected between the input and drain of the transistor; and a silicon controlled rectifier (SCR) with an anode connected to the input, a base connected to the drain of the transistor, and a cathode connected to the output.

14 Claims, 5 Drawing Sheets

CMOS ADJUSTABLE OVER VOLTAGE ESD AND SURGE PROTECTION FOR LED APPLICATION

TECHNICAL FIELD

Various exemplary embodiments disclosed herein relate generally to a CMOS adjustable over voltage electrostatic discharge (ESD) and surge protection for LED application.

BACKGROUND

LEDs (Light Emitting Diodes) are sensitive to over voltage stress during manufacturing and in the field during operation. During manufacturing, LEDs are subject to electrostatic discharge (ESD) that may damage the LED. During operation the LEDs may also experience over voltage application to the LED. This over voltage stress may cause permanent damage. Consequently, the LEDs need ESD and overvoltage protection. This protection may be provided by a protection device.

Another problem occurs when LEDs are connected in a series configuration where a failure of one device shuts down the entire LED system. In such a situation, a protection device may work as a bypass, offering a low resistance current path parallel to the failed diode. Accordingly, the driving current is not blocked by the failed LED so that the remaining LEDs may continue to work.

Current LED protection devices may be Zener diodes and other discrete solutions. Usually a Zener diode protects one LED. When creating a LED bank with more than one diode in series the Zener diodes are placed parallel to each LED. If an over voltage event occurs, the Zener diode shunts current. But this configuration does not work as a bypass for an failed open LED because the voltage drop of the Zener diode in combination with the driving current causes to much heat.

An alternative discrete solution is to replace the Zener diode by an active circuit that offers a lower on resistance which allows creating a bypass when a LED fails. The main problem with all of these protection elements is a slow turn on time. A slow turn on time decreases the field of application for the LEDS and cannot be used for fast switching applications, such as for example, using a LED in a pulse width modulation (PWM) module.

SUMMARY

Accordingly, there is a need for a LED protection device that provides ESD and surge protection, that allows bypass current to flow when an LED fails in an open state, and that is fast enough for all LED applications.

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may also relate to a light emitting diode protection circuit, including: a plurality of diodes connected in series; an input connected to a first diode of the plurality of diodes; an output; a first resistor connected between the plurality of diodes and the output; a transistor with a gate connected to a junction between the first resistor and the plurality of diodes and a source connected to the output; a second resistor connected between the input and drain of the transistor; and a silicon controlled rectifier (SCR) with an anode connected to the input, a base connected to the drain of the transistor, and a cathode connected to the output.

Various embodiments may also relate to a light emitting diode protection circuit, comprising: a plurality of diodes connected in series; an input connected to a first diode of the plurality of diodes; an output; a first resistor connected between the plurality of diodes and the output; a transistor with a gate connected to a junction between the first resistor and the plurality of diodes and a source connected to the output; and a silicon controlled rectifier (SCR) with an anode connected to the input, a base connected to the drain of the transistor, and a cathode connected to the output.

Various embodiments may also relate to a light emitting diode (LED) system, including: a plurality of LEDs connected in series; a LED protection circuit connected in parallel to each of the LEDs connected in series further including: a plurality of diodes connected in series; an input connected to a first diode of the plurality of diodes and to the anode of the LED; an output connected to the cathode of the LED; a first resistor connected between the plurality of diodes and the output; a transistor with a gate connected to a junction between the first resistor and the plurality of diodes and a source connected to the output; and a silicon controlled rectifier (SCR) with an anode connected to the input, a base connected to the drain of the transistor, and a cathode connected to the output.

BRIEF DESCRIPTION OF THE DRAWINGS

In order to better understand various exemplary embodiments, reference is made to the accompanying drawings wherein.

DETAILED DESCRIPTION

Referring now the drawings, in which like numerals refer to like components or steps, there are disclosed broad aspects of various exemplary embodiments.

Figure 1:
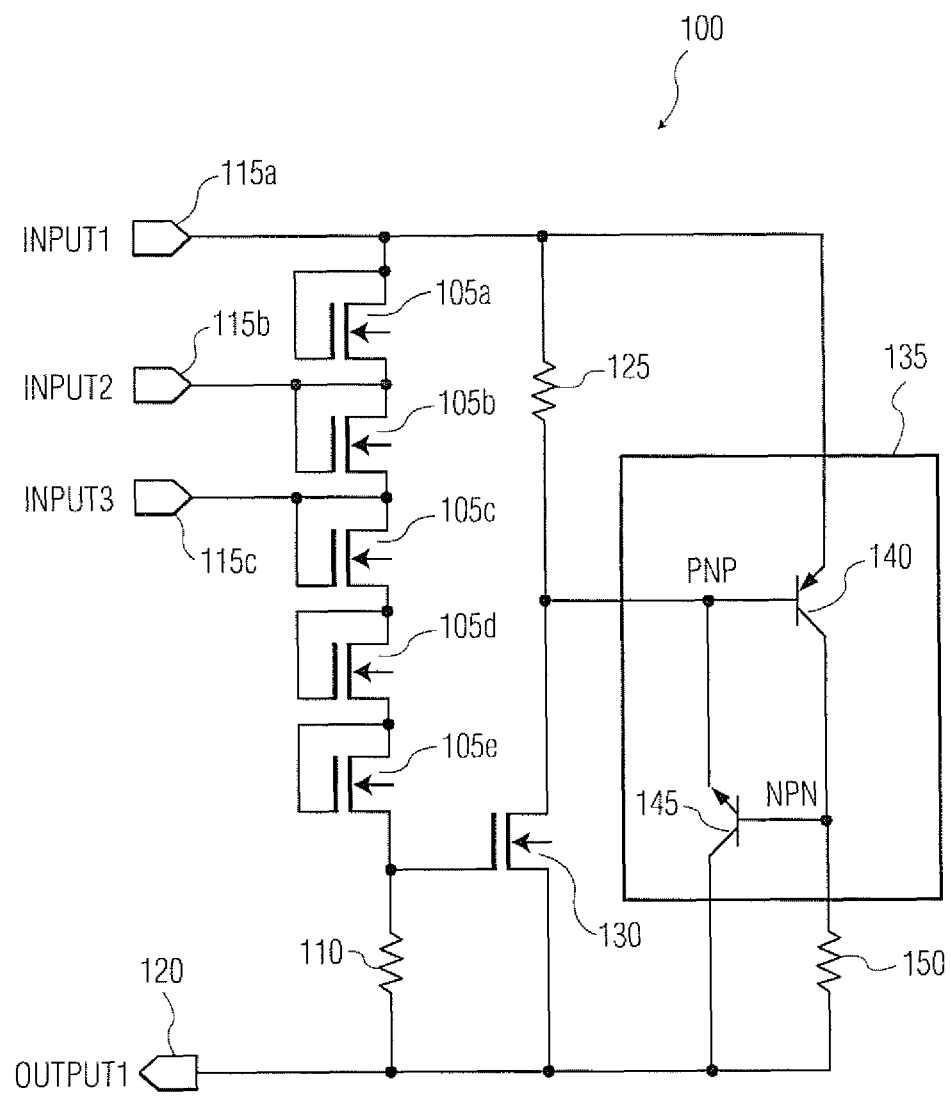
FIG. 1 is a circuit diagram illustrating an embodiment of the protection circuit.

FIG. 1 is a circuit diagram illustrating an embodiment of the protection circuit. The protection circuit 100 may include a plurality of transistor diodes connected in series 105a-105e, a first resistor 110, inputs 115a-115c, the output 120, a second resistor 125, a MOS transistor 130, a silicon controlled rectifier (SCR) 135, and a third resistor 150.

The plurality of transistor diodes connected in series 105 may be connected in series with a first resistor 110. A first input 115a may be connected to a first transistor diode 105a. The protection circuit 100 may also include additional inputs such as 115b and 115c. These additional inputs may be attached between various of the plurality of transistor diodes 105. The first resistor 110 may also be connected to an output 120. A second resistor 125 may be connected between the input 115a and the anode of the SCR 135. The CMOS transistor 130 may have a gate connected to a junction between a plurality of transistor diodes 105 and the first resistor 110. The MOS transistor also may have a source connected to the output 120 and a drain connected to the second resistor 125 and the gate of the SCR 135. The SCR 135 may have an anode connected to the input 115a and the second resistor 125 and a cathode connected to the output 120. While transistor diodes are discussed in this embodiment, other types of diodes may be used as well.

The protection circuit 100 may provide ESD and surge protection to a LED. When an input voltage is applied to the input 115a that is higher than the breakdown voltage of the plurality of transistor diodes 105, then current will flow through the plurality of transistor diodes 105 and through the first resistor 110. Accordingly, the number of transistor diodes 105 is selected to provide a desired breakdown voltage. Further, as illustrated in FIG. 1, additional inputs 115b and 115c allow for additional control over the breakdown voltage used to protect the LED. For example, a second input 115b connects to a junction between a first transistor diode 105a and a second transistor diode 105b. By connecting an LED to the second input 115b and shorting the second input 115b to the first input 115a, the breakdown voltage of the plurality of transistor diodes 105 may be reduced. The input 115c illustrates how the breakdown voltage may be further reduced. The number and location of the multiple inputs 115 may be selected to provide a desired variety of breakdown voltages that may be available when combining the protection circuit 100 with a LED.

The operation of the protection circuit 100 will now be described. When an input voltage exceeding the break down voltage of the plurality of transistor diodes 105 is applied to the input 115 of the protection circuit 100, current may flow through the plurality of transistor diodes 105 and the first resistor 110. The current flow may result in a voltage across the first resistor 110, which voltage may also be applied to the gate of the MOS transistor 130. This voltage may turn on the MOS transistor 130 allowing the current to flow through the first resistor 125 and the MOS transistor 130. The current may flow through this path because its resistance may be lower than the resistance through the plurality of transistor diodes 105 and the first resistor 110. The current flowing through the second transistor 125 may result in a voltage being applied between the anode and the gate of the SCR 135, which turns on the SCR 135, thus allowing current from the input to flow through the SCR 135. Because the SCR 135 may have a low impedance, less power may be lost, and less heat may be generated.

Further, when an LED fails, the voltage across the LED may increase to a value above the breakdown voltage of the plurality of transistor diodes 105. Accordingly, the protection circuit 100 becomes active, and the input current bypasses the failed LED allowing other LEDs that may be connected in series to continue to operate.

Figure 2:
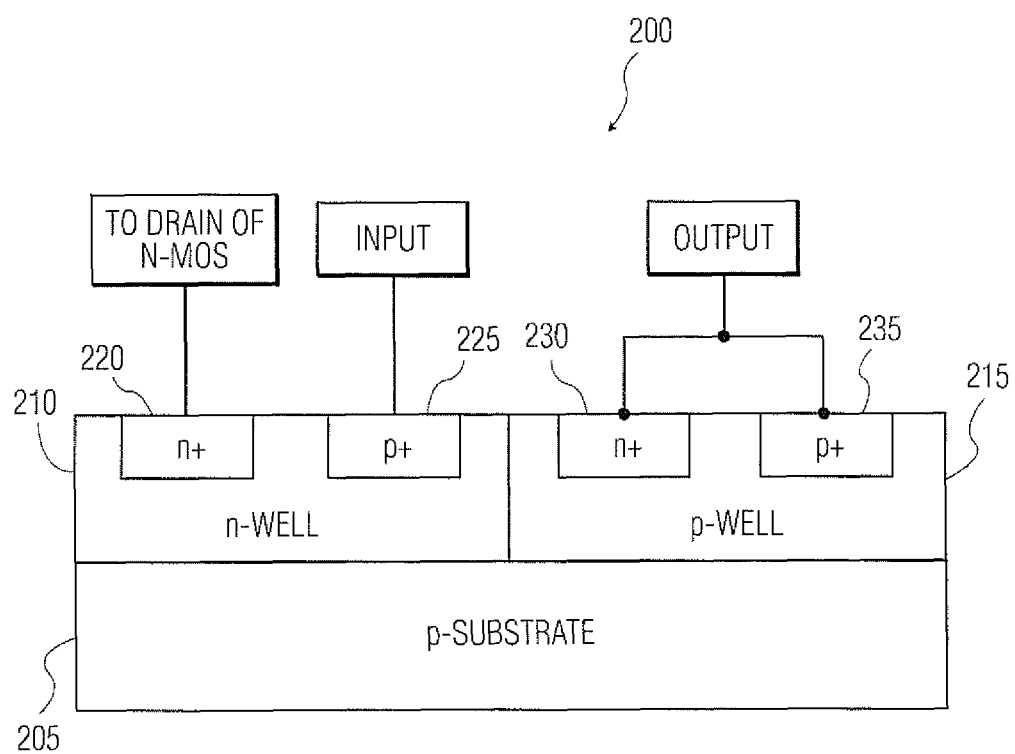
FIG. 2 is a cross section of an embodiment of a silicon controlled rectifier.

The SCR 135 is illustrated as including a PNP transistor 140 and a NPN transistor 145. This illustration of the SCR indicates the traditional structure of an SCR using two bipolar transistors. FIG. 2 is a cross section of an embodiment of a silicon controlled rectifier. The SCR 200 may be fabricated using standard CMOS processes. The SCR 200 includes a p-substrate 205, a n-well 210, a p-well 215, a first n+ region 220, a first p+ region 225, a second n+ region 230, and second p+ region 235. A first silicon layer may be formed and doped to produce the p-substrate 205. Then, a second silicon layer may be formed, and doping is applied to create an n-well 210 and a p-well 215. Next, using a masking and doping process the first n+ region 220 and the second n+ region 230 may be formed. Finally, using a masking and doping process the first p+ region 225 and the second p+ region 235 may be formed. If a CMOS process is used for the protection device 100 then the diffusions used for building the transistors may be re-used: the first n+ region 220 may be built similar to the bulk contact of the PMOS-transistor, the first p+ region 225 may be built similar to the source-drain-diffusion of the PMOS, n-well 210 may be built similar to the n-well of the PMOS; the second p+ region 235 may be built similar to the bulk contact of the NMOS-transistor, the second n+ region 230 may be built similar to the source-drain-diffusion of the NMOS, and the p-well 215 may be built similar to the p-well of the NMOS;

Further, the first n+ region 220, which may act as the gate of the SCR 200, may be connected to the drain of the MOS transistor 130. The first p+ region 225, which may act as the anode, may be connected to the input 115. Finally the second n+ region 230 and the second p+ region 235, which may act as the cathode, may be connected to the output 120. This implementation of the SCR 200 is provided for illustration purposes. Other designs and structures for the SCR 200 may be used that are compatible with CMOS manufacturing processes.

In designing and fabricating the MOS transistor 130 and the SCR 135, it may be desire able to have short channel lengths. These short channel lengths allow for fast turn on times for use in high speed applications. Thus, the design of the MOS transistor 130 and the SCR 135 may be driven by the speed at which the LED will be operated.

Figure 3:
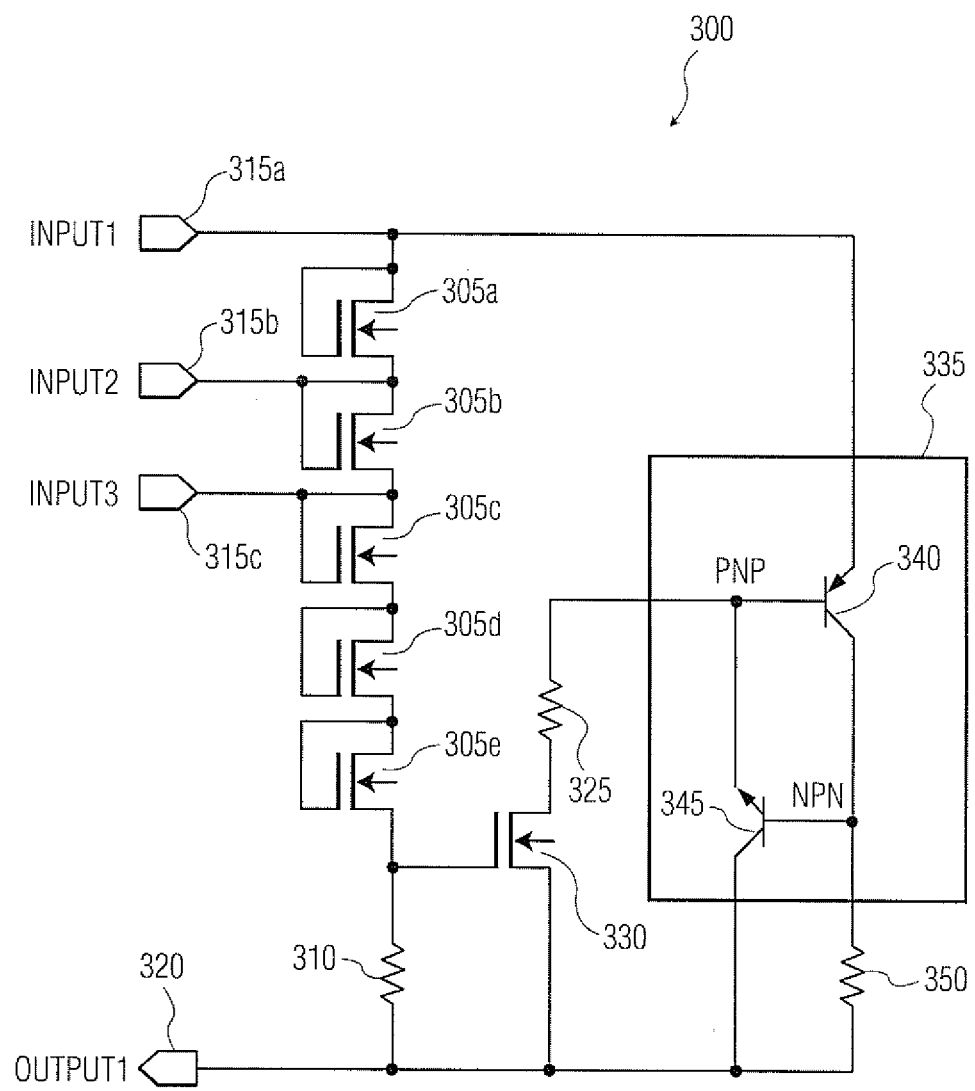
FIG. 3 is a circuit diagram illustrating another embodiment of the protection circuit.

FIG. 3 is a circuit diagram illustrating an embodiment of the protection circuit. The protection circuit 300 may include a plurality of transistor diodes connected in series 305a-305e, a first resistor 310, inputs 315a-315c, the output 320, a second resistor 325, a MOS transistor 330, a silicon controlled rectifier (SCR) 335, and a third resistor 350.

The plurality of transistor diodes connected in series 305 may be connected in series with a first resistor 310. A first input 315a may be connected to a first transistor diode 305a. The protection circuit 300 may also include additional inputs such as 315b and 315c. These additional inputs may be attached between various of the plurality of transistor diodes 305. The first resistor 310 may also be connected to an output 320. A second resistor 325 may be connected between the gate of the SCR 335 and the drain of the MOS transistor 330, but this resistor may also be omitted. The MOS transistor 330 may have a base connected to a junction between a plurality of transistor diodes 305 and the first resistor 310. The SCR 335 may have an anode connected to the input 315a and a cathode connected to the output 320.

The plurality of transistor diodes 305 may provide ESD and surge protection to a LED. When an input voltage is applied to the input 315a that is higher than the breakdown voltage of the plurality of transistor diodes 305, then current will flow through the plurality of transistor diodes 305 and through the first resistor 310. Accordingly, the number of transistor diodes 305 is selected to provide a desired breakdown voltage. Further, as illustrated in FIG. 3, additional inputs 315b and 315c allow for additional control over the breakdown voltage used to protect the LED. For example, a second input 315b connects to a junction between a first transistor diode 305a and a second transistor diode 305b. By connecting an LED to the second input 315b and shorting the second input 315b to the first input 315a, the breakdown voltage of the plurality of transistor diodes 305 may be reduced. The input 315c illustrates how the breakdown voltage may be further reduced. The number and location of the multiple inputs 315 may be selected to provide a desired variety of breakdown voltages that may be available when combining the protection circuit 300 with a LED.

The operation of the protection circuit 300 will now be described. When an input voltage exceeding the break down voltage of the plurality of transistor diodes 305 is applied to the input 315 of the protection circuit 300, current may flow through the plurality of transistor diodes 305 and the first resistor 310. The current flow may result in a voltage across the first resistor 310, which voltage may also be applied to the gate of the MOS transistor 330. This voltage may turn on the MOS transistor 330, which allows current to flow between the anode and the gate of the SCR 335 and through the MOS transistor 330. This current flow turns on the SCR 335, thus allowing current from the input to flow through the SCR 335. Until the SCR 335 reaches its low ohmic state (this is during the turn on time of the SCR) the current flow between the anode and the gate of the SCR 335 and through the MOS transistor 330 will drain the external stress to the output, thus protecting the LED placed in parallel from damage due to over current and or over voltage. Thus a protection device with fast turn on switching is realized. Because the SCR 335 may have a low impedance, less power may be lost, and less heat may be generated.

Further, when an LED fails, the voltage across the LED may increase to a value above the breakdown voltage of the plurality of transistor diodes 305. Accordingly, the protection circuit 300 becomes active, and the input current bypasses the failed LED allowing other LEDs that may be connected in series to continue to operate.

Figure 4:
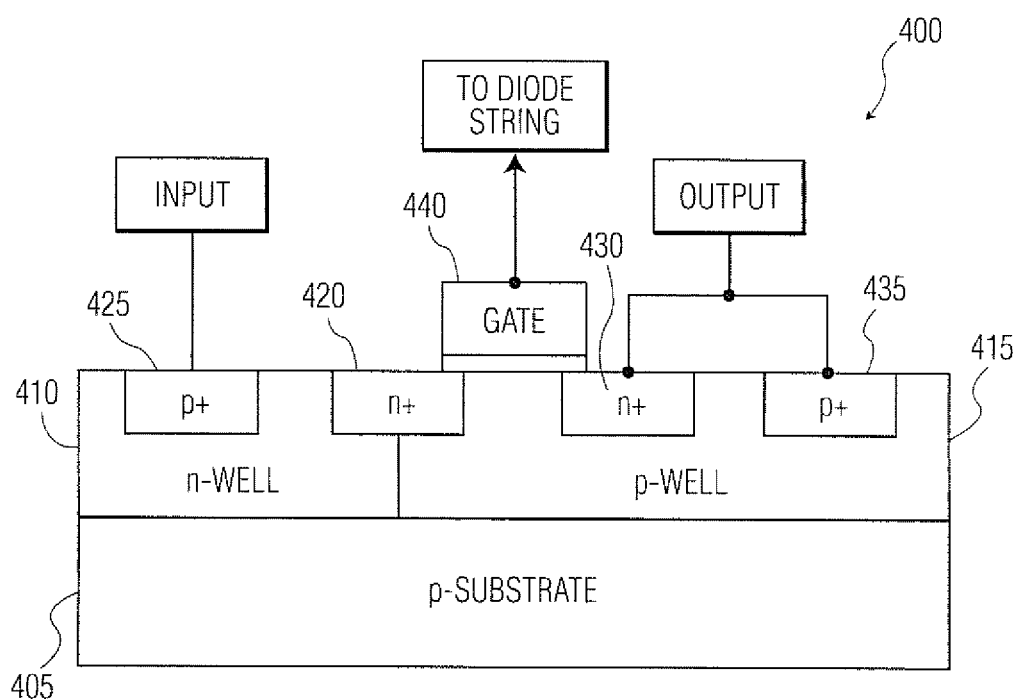
FIG. 4 is a cross section of another embodiment of a silicon controlled rectifier.

The SCR 335 is illustrated as including a PNP transistor 340 and a NPN transistor 345. This illustration of the SCR indicates the traditional structure of an SCR using two bipolar transistors. FIG. 4 is a cross section of another embodiment of a silicon controlled rectifier that also includes the MOS transistor 330. The SCR 400 may be fabricated using standard CMOS processes. The SCR 400 includes a p-substrate 405, a n-well 410, a p-well 415, a first n+ region 420, a first p+ region 425, a second n+ region 430, second p+ region 435, and a gate 440. A first silicon layer may be formed and doped to produce the p-substrate 405. Then, a second silicon layer may be formed, and doping is applied to create an n-well 410 and a p-well 415. Next, using a masking and doping process the first n+ region 420 and the second n+ region 430 may be formed. Next, using a masking and doping process the first p+ region 425 and the second p+ region 435 may be formed. Finally, the gate 440 may be formed over a portion of the p-well 415 and a portion of the first and second n+ regions 420, 430.

Further, the first p+ region 425, which may act as the anode, may be connected to the input 315. Next, the second n+ region 430 and the second p+ region 435, which may act as the cathode, may be connected to the output 320. This implementation of the SCR 400 is provided for illustration purposes. Other designs and structures for the SCR 400 may be used that are compatible with CMOS manufacturing processes.

In designing and fabricating the MOS transistor 330 and the SCR 335, it may be desire able to have short channel lengths. These short channel lengths allow for fast turn on times for use in high speed applications. Thus, the design of the MOS transistor 330 and the SCR 335 may driven by the speed at which the LED will be operated.

The protection circuits described above may be designed in a standard CMOS process. The advantage of this protection circuit is the combination of an ESD and surge protection with a fast turn on time provided by a combination of a MOS transistor and a SCR. The SCR typically has a small voltage drop. As a result, it may be possible to handle current in ranges of more than 500 mA without overheating. The protection circuit further may be designed with an adjustable breakdown voltage for a wide working range by selecting among a plurality of inputs. Further, the compact CMOS design allows a placement of other different active circuits (e.g., LED driver and supply units) on the same die. The compact design also may allow several of the protection devices 100 to be placed on one crystal. The solution may be produced in a packaged device or as chip scale package.

Figure 5:
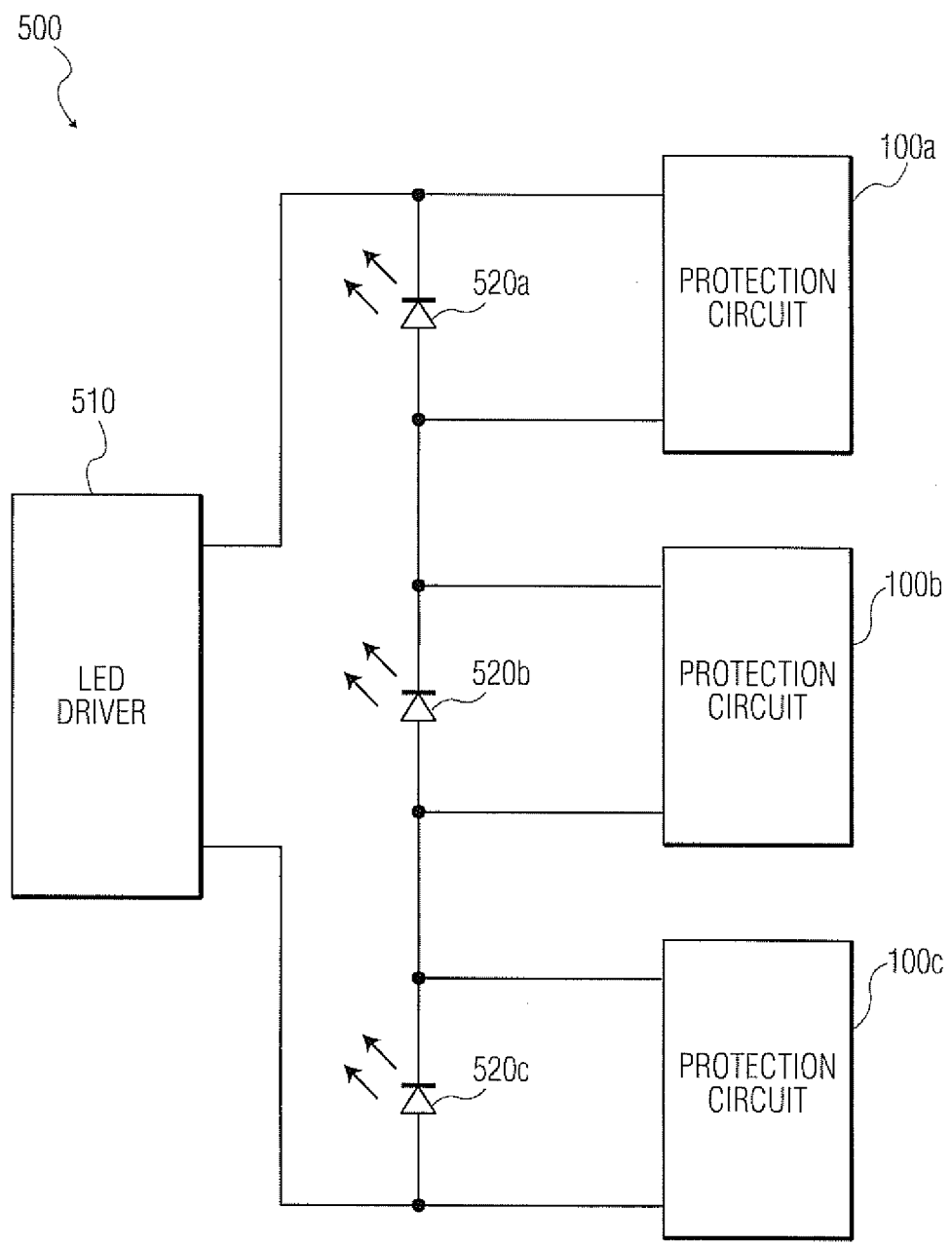
FIG. 5 illustrates a light emitting diode system using the protection circuit.

FIG. 5 illustrates a light emitting diode system using the protection circuit. The LED system 500 may include LEDs 520a, 520b, and 520c that may be connected in series. Each of the LEDs 520a, 520b, and 530c may have a protection circuit 100a, 100b, and 100c connected in parallel. The LEDs 520 may be driven by a LED driver 510. If LED 520b fails, then the protection circuit 100b may route current applied to the failed LED 520b around failed LED 520b. This allows current to still flow to LEDs 520a and 520c, thus preventing the complete failure of the LED system 500. Further, if there is a current or voltage surge applied to the LEDs 520, the protection circuits 100 will route the current or voltage away from the LEDs to prevent damage to the LEDs.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A light emitting diode protection circuit, comprising:
   a plurality of diodes connected in series;
   a first input connected to a first diode of the plurality of diodes;
   a second input connected to a junction between two of the plurality of diodes, wherein shorting the first input to the second input reduces a breakdown voltage of the plurality of diodes;
   an output;
   a first resistor connected between the plurality of diodes and the output;
   a transistor with a gate connected to a junction between the first resistor and the plurality of diodes and a source connected to the output;
   a second resistor connected between the first input and a drain of the transistor; and
   a silicon controlled rectifier (SCR) with an anode connected to the first input, a base connected to the drain of the transistor, and a cathode connected to the output.

2. The light emitting diode protection circuit of claim 1, wherein a plurality of the light emitting diode protection circuits are configured to protect a plurality of LEDs connected in series.

3. The light emitting diode protection circuit of claim 1, wherein the transistor is a NMOS transistor.

4. The light emitting diode protection circuit of claim 1, wherein the plurality of diodes are transistor diodes.

5. The light emitting diode protection circuit of claim 1, wherein the light emitting diode protection circuit is a CMOS chip.

6. A light emitting diode protection circuit, comprising:
a plurality of diodes connected in series;
a first input connected to a first diode of the plurality of diodes;
a second input connected to a junction between two of the plurality of diodes, wherein shorting the first input to the second input reduces a breakdown voltage of the plurality of diodes;
an output;
a first resistor connected between the plurality of diodes and the output;
a transistor with a gate connected to a junction between the first resistor and the plurality of diodes and a source connected to the output; and
a silicon controlled rectifier (SCR) with an anode connected to the first input, a base connected to the drain of the transistor, and a cathode connected to the output.

7. The light emitting diode protection circuit of claim 6, wherein a plurality of light emitting diode protection circuits are configured to protect a plurality of LEDs connected in series.

8. The light emitting diode protection circuit of claim 6, wherein the transistor is a NMOS transistor.

9. The light emitting diode protection circuit of claim 6, wherein the plurality of diodes are transistor diodes.

10. The light emitting diode protection circuit of claim 6, wherein the light emitting diode protection circuit is a CMOS chip.

11. A light emitting diode (LED) system, comprising:
a plurality of LEDs connected in series;
a plurality of LED protection circuits each connected in parallel to one of the plurality of LEDs connected in series, each of the plurality of LED protection circuits further comprising:
a plurality of diodes connected in series;
a first input connected to a first diode of the plurality of diodes and a first of the plurality of LEDs;
a second input connected to a junction between two of the plurality of diodes and connected to the first input, wherein shorting the first input to the second input reduces a breakdown voltage of the plurality of diodes;
an output connected to a last of the plurality of the LEDs;
a first resistor connected between the plurality of diodes and the output;
a transistor with a gate connected to a junction between the first resistor and the plurality of diodes and a source connected to the output; and
a silicon controlled rectifier (SCR) with an anode connected to the first input, a base connected to the drain of the transistor, and a cathode connected to the output.

12. The light emitting diode protection circuit of claim 11, further comprising:
a second resistor connected between the gate of the SCR and the drain of the transistor.

13. The light emitting diode protection circuit of claim 11, wherein the transistor is a NMOS transistor.

14. The light emitting diode protection circuit of claim 11, wherein the plurality of diodes are transistor diodes.

* * * * *